United States Patent [19]

Gilbert

[11] 4,156,283

[45] May 22, 1979

[54] MULTIPLIER CIRCUIT

[75] Inventor: Barrie Gilbert, Portland, Oreg.

[73] Assignee: Tektronix, Inc., Beaverton, Oreg.

[21] Appl. No.: 839,145

[22] Filed: Oct. 3, 1977

Related U.S. Application Data

[60] Division of Ser. No. 705,634, Jul. 15, 1976, Pat. No. 4,075,574, which is a continuation of Ser. No. 623,214, Oct. 16, 1975, abandoned, which is a division of Ser. No. 540,499, Jan. 13, 1975, Pat. No. 3,931,583, which is a continuation of Ser. No. 258,111, May 30, 1972, abandoned, which is a division of Ser. No. 27,765, Apr. 13, 1970, Pat. No. 3,689,752, which is a continuation-in-part of Ser. No. 701,257, Jan. 29, 1968, abandoned, and Ser. No. 835,558, Jun. 23, 1969, abandoned.

[51] Int. Cl.² ............................................. G06G 7/16
[52] U.S. Cl. ................................... 364/841; 307/229; 328/160; 364/857

[58] Field of Search ................ 364/841, 857; 307/229; 328/160; 330/252, 257, 258, 310, 253

[56] References Cited

U.S. PATENT DOCUMENTS

| 3,197,626 | 7/1965 | Platzer, Jr. ........................ 364/857 X |
| 3,304,419 | 2/1967 | Huntley, Jr. et al. ........... 364/857 X |
| 3,432,650 | 3/1969 | Thompson ............................ 364/841 |

*Primary Examiner*—Joseph F. Ruggiero
*Attorney, Agent, or Firm*—George T. Noe

[57] ABSTRACT

A linear analog multiplier circuit for multiplying electrical quantities comprises a pair of differentially connected nonlinear control devices, for example, transistors, and at least one further semiconductor junction device exhibiting logarithmic characteristics coupled thereto for compensating for the nonlinear properties of the control devices.

1 Claim, 25 Drawing Figures

MULTIPLIER CIRCUIT

CROSS REFERENCE TO RELATED APPLICATIONS

This application is a division of Ser. No. 705,634, filed July 15, 1976, now U.S. Pat. No. 4,075,574, which is a continuation of Ser. No. 623,214, filed Oct. 16, 1975, now abandoned, which is a division of Ser. No. 540,499, filed Jan. 13, 1975, and now U.S. Pat. No. 3,931,583, which is a continuation of Ser. No. 258,111, filed May 30, 1972, now abandoned, which is a division of Ser. No. 27,765, filed Apr. 13, 1970, now U.S. Pat. No. 3,689,752, which is a continuation-in-part of my application Ser. No. 701,257, filed Jan. 29, 1968, entitled "Wideband Differential Amplifier", and now abandoned, as well as my application Ser. No. 835,558, filed June 23, 1969, entitled "Wideband Differential Amplifier", and now abandoned.

BACKGROUND OF THE INVENTION

Most wideband amplifiers comprise not only active elements such as transistors or vacuum tubes, but also a plurality of other components, employed, for example, to define the stage gain or to shape the response of the circuit so as to improve circuit linearity or to compensate for non-linearities in other circuits or devices. Wideband amplifiers of this type are not well adapted to semiconductor integrated circuit techniques, particularly those fabricated with PN junctions as a means of isolating the collector areas from the substrate material, because of the high capacitances associated with such structures. These capacitances in conjunction with the circuit impedances seriously limit the bandwidth of the usual amplifier converted to an integrated circuit structure. Furthermore, nonlinearity of operation is a problem associated with semiconductor structure operation.

SUMMARY OF THE INVENTION

According to the present invention, a wideband amplifier well adapted to integrated circuit techniques comprises a differentialy connected pair of control devices, e.g. transistors, having a pair of input devices coupled respectively to the input terminals of such control devices. The input devices each exhibit a logarithmic voltage versus current characteristic which causes the output of the differential circuit to become a linear and amplified function of input. The aforementioned input devices suitably comprise transistors having their base-emitter junctions essentially coupled across the input or control terminals of the aforementioned control devices to provide such logarithmic characteristic. According to the present invention, a linear analog multiplier circuit is provided which multiplies electrical quantities by virtue of the aforementioned logarithmic characteristic. A pair of differentially-connected control devices having nonlinear input devices coupled thereto produce an output which is linearly related to the input factors to be multiplied.

It is therefore one object of the present invention to provide an improved and linear multiplier circuit.

It is a further object of the present invention to provide an improved and linear multiplier circuit adapted to integrated circuit techniques and wherein the effect of ohmic resistance is substantially compensated.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

DETAILED DESCRIPTION

Figure 1:
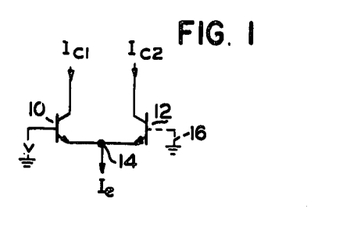
FIG. 1 is a schematic diagram of a circuit employed in explaining the present invention.

FIG. 1 illustrates a differential amplifier circuit which will be preliminarily discussed in explaining the operation of the present invention. The FIG. 1 circuit includes a pair of control devices or transistors 10 and 12 having their common emitter terminals connected together at 14. An input voltage, v, is provided at the control terminal or base terminal of transistor 10 while the control or base terminal of transistor 12 may be provided with an input voltage complementally related to v, or which may be grounded as indicated by dashed lines at 16. A common current $I_e$ is supplied to terminal 14, while current outputs $I_{c1}$ and $I_{c2}$ are produced at the output or collector terminals of transistors 10 and 12. The respective output currents, for the circuit with the base of transistor 16 grounded, are given by the following expressions:

$$I_{c1} = \frac{e^{qv/kt}}{1 + e^{qv/kt}} \cdot I_e \tag{1}$$

$$I_{c2} = \frac{1}{1 + e^{qv/kt}} \cdot I_e \tag{2}$$

wherein q = charge on an electron, t is absolute temperature, k is Boltzmann's constant, and e is the base of natural logarithms. The FIG. 1 circuit produces a controlled differential current output, but clearly the control function produced by the FIG. 1 circuit is nonlinear and is very temperature sensitive.

Figure 2:
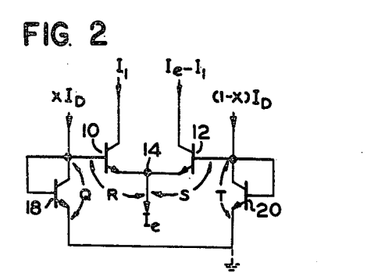
FIG. 2 is a schematic diagram of a first differential amplifier circuit according to the present invention.

Now, consider the circuit as illustrated in FIG. 2. This circuit also includes differentially connected control devices or transistors 10 and 12 having their common emitter terminals connected together at 14. The common terminal 14 is again supplied with a current $I_e$. In addition, a first input device, here comprising transistor 18, is coupled to the control or base terminal of transistor 10. The collector and base terminals of transistor 18 are connected to the base of transistor 10, and the emitter of transistor 18 is grounded. The input device transistor 18 is thereby connected to provide a semiconductor junction, i.e. the transistor 18 base-emitter junction, coupled substantially in parallel with the input to transistor 10. As hereinafter more fully described, input device transistor 18 operates according to a logarithmic characteristic acting to improve appreciably the linearlity of the amplifying circuit according to the present invention.

A second input device here comprising a transistor 20 is connected in a like manner to the control or base terminal of transistor 12, while suitable input currents $xI_D$ and $(1-x)I_D$ are coupled respectively to the base terminals of transistors 18 and 20. The input currents are complementary, it being understood that x varies between 0 and 1. The value of x, then, is the actual variable input to the stage and may be thought of as a modulation index for current $I_D$, the latter desirably being constant. Alternatively, the base terminal of transistor 12 may be grounded and the emitters of transistors 18 and 20 may be returned to a suitable source of current. By means of such alternative configuration, a single-sided input can be converted to a differential output.

Now, consider the voltages across the base-emitter junction of the various transistors, as illustrated in FIG. 2, with input currents $xI_D$ and $(1-x)I_D$ applied as indicated. The input current $xI_D$ produces an input voltage Q between the base terminal and ground of transistor 18, and a voltage R is produced across the base-emitter junction of transistor 10. Similarly voltages T and S exist across the base-emitter junctions of transistors 20 and 12. It will be understood that with moderate transistor input current ratios, that is for moderate values of x, the voltage swings involved are very small, e.g. on the order of a few millivolts. The junction voltages may be expressed as follows:

$$Q = \frac{kt}{q} \log \frac{xI_D}{i_s} \tag{3}$$

$$R = \frac{kt}{q} \log \frac{I_1}{i_s} \tag{4}$$

$$S = \frac{kt}{q} \log \frac{(I_e - I_1)}{i_s} \tag{5}$$

$$T = \frac{kt}{q} \log \frac{(1-x)I_D}{i_s} \tag{6}$$

In the above equations, k, t, and q have previously defined meanings, and $i_s$ refers to the junction saturation currents which will be substantially the same when the devices 10, 12, 18, and 20 ae realized upon the same planar monolithic integrated circuit structure. Logarithms are to the base e. Furthermore, considering the voltage drops, around the loop starting at ground, $Q - R = T - S$. (7)

and therefore $$\log \frac{xI_D}{I_1} - \log \frac{(1-x)I_D}{I_e - I_1} = 0 \tag{8}$$

or, $$\log \frac{xI_D(I_e - I_1)}{I_1(1 - x)I_D} = 0, \text{ and } \frac{xI_D(I_e - I_1)}{I_1(1 - x)I_D} = 1 \tag{9}$$

Therefore, $$xI_D(I_e - I_1) = (1 - x)I_DI_1 \tag{10}$$

or, $$xI_DI_e = I_1[(1-x)I_D + xI_d] \tag{11}$$

As a result, $$I_1 = xI_e \tag{12}$$

Thus the current appearing at the output or collector terminal of transistor 10 is equal to the input index, x, multiplied by the common emitter current, $I_e$, substantially independent of the value of $I_D$, and independent of temperature. The circuit provides linear gain whereby the output at the collector of transistor 10 is a linear and amplified function of x while the complementally related output at the collector of transistor 12 equals $(1-x)I_e$. The circuit is non-complex, and linear current gain is achieved without resorting to complicated feedback methods.

The above mathematical analysis assumes $I_D$ is small or the same order of magnitude as $I_e$, $I_D$ ordinarily being somewhat smaller than $I_e$. The above analysis also assumes that the transistors employed have quite high betas, and that (qv/kt>1, where v is a particular junction voltage. Moreover, the transistors should have low bulk resistances in the base-emitter junction. The gain of the stage is, so far as the input factor x is concerned, equal to ($I_e/I_D$), with the output being understood to be taken as a current differential between the output or collector terminals of transistors 10 and 12.

Figure 3:
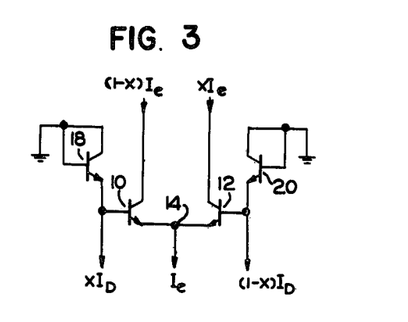
FIG. 3 is a schematic diagram of a second differential amplifier according to the present invention.

FIG. 3 illustrates a circuit according to the present invention wherein the input currents, $xI_D$ and $(1-x)I_D$ are provided from complementary negative sources. This configuration is quite useful as will hereinafter become more evident. Similar components in this embodiment are referred to with the same reference numerals employed above. The collector currents are, respectively, $(1-x)I_{e\ and\ xI_e}$. As in the case of the FIG. 2 circuit, only the ratio of input currents is important in determining the output.

Figure 4:
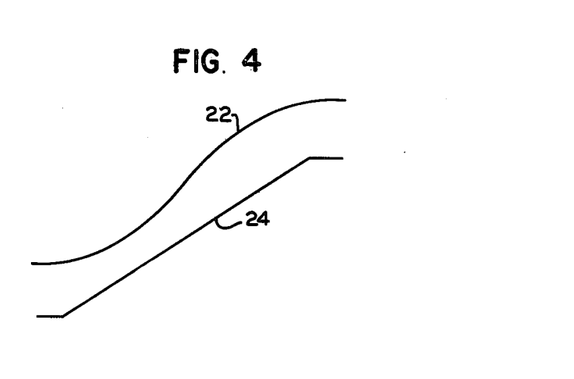
FIG. 4 is a plot of the linear response characteristic of a circuit according to the present invention, in comparison with that of a prior circuit.

FIG. 4 plots the transfer characteristic 22 for a voltage-driven pair such as illustrated in FIG. 1, with the transfer characteristic 24 for the modified current-driven pair being illustrated, for example, in FIG. 3. This plot was taken from an oscilloscope representation, and the improved linearity provided is quite apparent.

Figure 5:
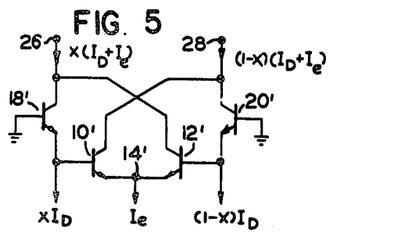
FIG. 5 is a schematic diagram of a third and preferred differential amplifier circuit according to the present invention.
Figure 6:
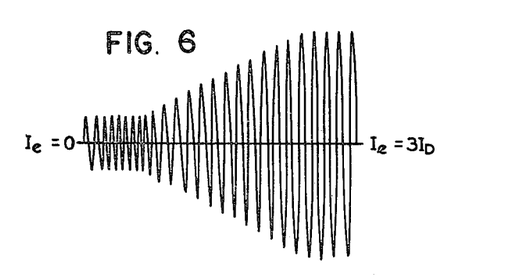
FIG. 6 illustrates an alternating current output for a circuit according to the present invention, with circuit gain being varied.

FIG. 5 illustrates a preferred embodiment of the present invention having improved gain. In this circuit the input device transistors, here numbered 18' and 20', are connected to add input currents, $xI_D$ and $(1-x)I_D$ to the amplifier output currents. In the illustrated embodiment, the collector of transistor 18', instead of being connected to the grounded base of the transistor, is connected to the output or collector terminal of transistor 12'. Similarly, the collector terminal of transistor 20' is connected to the collector terminal of transistor 10'. The input currents are thereby combined with the output currents in an additive phase sense whereby outputs at output terminals 26 and 28 respectively become $x(I_D+I_e)$ and $(1-x)(I_D+I_e)$, thereby providing additional gain for the circuit. Thus, even at $I_e=0$, the current gain of the circuit is nearly unity, but for a finite $I_e$ the gain becomes $(1+I_e/I_D)$, this value being accurate for fairly small ratios of $I_e/I_D$. FIG. 6 illustrates an alternating current output provided between terminals 26 and 28, as the gain of the circuit is varied from 1 to 4, that is as $I_e/I_D$ is varied from 0 to 3.

It is desirable in the FIG. 5 circuit, as in the previous circuits, that the stage gain be kept fairly small because as the ratio $I_e/I_D$ rises, the effects of transistor beta are more pronounced, and it is desired that operation be substantially beta indepenent. Furthermore, the effects of bulk resistance are small for small ratios of $I_e/I_D$. Therefore, the additional gain provided by adding input currents to output currents is of some importance.

Figure 7:
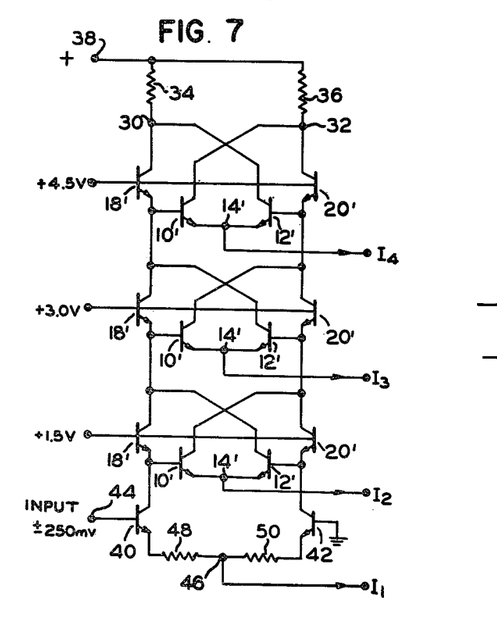
FIG. 7 is a schematic diagram of a cascaded amplifier according to the present invention.

The amplifier circuits according to the present invention are advantageously cascaded, with the output currents of one stage constituting the input currents for the next. In particular, the preferred circuit configuration of FIG. 5 is advantageously cascaded as illustrated in FIG. 7. While several supply voltages are employed, very little supply voltage difference per stage is required. In a constructed embodiment, there was only 36 millivolts of voltage swing at the input points for changes in the index, x, from 0.2 to 0.8. Therefore the supply voltage differentials needed may be small, exemplary values being given in FIG. 7.

FIG. 7 illustrates a typical 3-stage amplifier wherein similar elements are referred to with like reference numerals, each stage of the amplifier substantially corresponding to the circuit according to the FIG. 5 embodiment. The rise time with a constructed version was 0.6 nanoseconds per stage, and the peak output swing at the final current output terminals 30 and 32 was ±100 milliamperes.

The cascaded circuit of FIG. 7 is also suitably provided with load resistors 34 and 36 coupling terminals 30 and 32 respectively to a positive power supply terminal 38 for providing an output voltage swing at terminals 30 and 32. If desired, a pair of isolating transistors (not shown) may be included between load resistors 34 and 36, and the remainder of the circuit. For example, the collector-emitter path of one such transistor may be inserted between resistor 34 and terminal 30 while the collector-emitter path of another such transistor may be inserted between resistor 36 and terminal 32. The bases of these transistors would then be connected to an appropriate positive voltage source which in the FIG. 7 example would be approximately 6 volts.

It should be observed that no interconnecting components or coupling elements are employed by the stages in the FIG. 7 circuit. Therefore, the cascaded amplifier is ideally adapted to planar NPN semiconductor integrated circuit fabrication. Of course, PNP transistor elements or the like may alternatively be employed. Since no intercoupling elements are employed, the disadvantages of such components in integrated circuit construction are avoided. Furthermore, since the voltage swings occurring in the circuit tend to be quite small, capacitance problems are also substantially avoided or eliminated.

The input currents to the amplifier of FIG. 7 are suitably provided by first pair of transistors 40 and 42 wherein the base of transistor 40 is connected to circuit input terminal 44 and wherein the base of transistor 42 is suitably grounded. The emitters of transistors 40 and 42 are connected to common terminal 46 by resistors 48 and 50, respectively, to provide emitter degeneration, and terminal 46 is connected to a first supply current, $I_1$. Resistors 48 and 50 cooperate to provide complementary currents at the collectors of transistors 40 and 42 in response to an input voltage applied at terminal 44. The gain of this circuit can be controlled by controlling $I_1$ and by controlling the ratio of supply currents, $I_4$, $I_3$, and $I_2$ with respect to $I_1$.

An additional advantage contributed by the FIG. 7 cascaded circuit relates to its minimum power dissipation. Quiescent conditions are automatically satisfied since the quiescent current in each successive stage increases at exactly the same rate as the signal swing. Therefore, minimum power dissipation takes place to realize a given output current swing, and all stages limit at the same input level. Also, of course, the voltage across each stage is low, and therefore the circuit can be operated at reasonably high current levels without encountering dissipation problems. Moreover, collector saturation with its attendant overload recovery time does not occur in this circuitry.

Also, according to the circuitry of the present invention, an optimum number of stages can be cascaded for realizing maximum bandwidth, assuming a single pole on the real axis at each stage can be calculated. For modest gains, say from 10 to 50 times in current, the optimum number may be three to five stages. With ordinary circuitry, the optimum number of stages may not be used because of the prohibitive cost of fast transistors, and therefore bandwidth may suffer. In employing the circuitry herein disclosed, fabricated with integrated circuit techniques, such a disadvantageous compromise need not be made because the cost of extra stages in the case of complete circuit on one die is trivial, the main cost arising in packaging.

Figure 13:
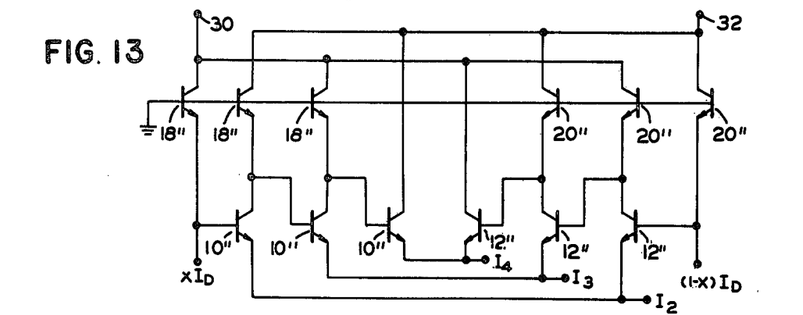
FIG. 13 is a schematic diagram of an alternative form of cascaded amplifier according to the present invention.

A circuit similar to the FIG. 7 circuit is illustrated in FIG. 13 wherein similar elements are referred to by like reference numerals. In the FIG. 13 circuit, multiple intermediate voltage supply points are eliminated. Returning for a moment to the FIG. 7 circuit, the control device transistors 10' and 12' operate at effectively higher collector voltages than do input device transistors 18' and 20', due to the emitter-base voltages of transistors 10' and 12'. The FIG. 13 circuit takes advantage of this voltage differential, and the collectors of input device transistors 18" and 20" are connected respectively in "parallel" to terminals 30 and 32, in additive phase relation, rather than being connected in series with the next input device transistor. Otherwise, the circuit is substantially the same as the similarly numbered portion of FIG. 7.

Figure 8:
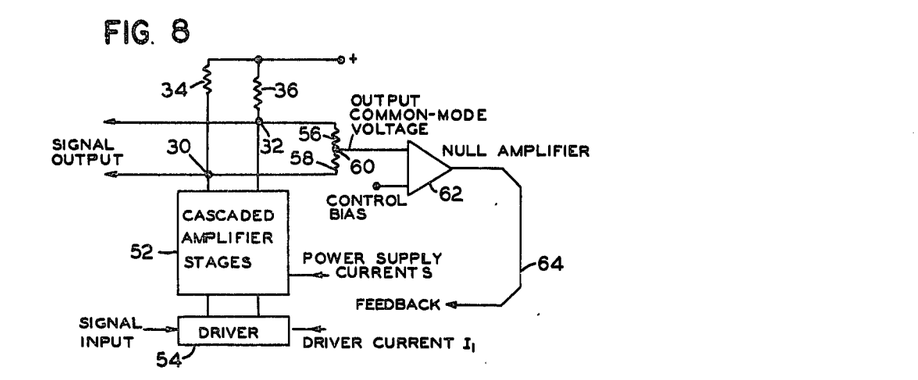
FIG. 8 is a schematic diagram for a feedback circuit in accordance with the present invention for rendering circuit amplification substantially independent of transistor beta.

FIG. 8 illustrates a circuit compensating for the effect of transistor beta on overall gain. Although this effect is small, particularly when the value of beta is high and when the hereinbefore mentioned current ratio $I_e/I_D$ is small, the feedback circuit according to FIG. 8 may be employed to substantially eliminate the effect of beta. Referring to the FIG. 8 circuit, block 52 comprises the cascaded amplifier stages as illustrated in FIG. 7 and driver 54 corresponds to the transistors 40 and 42 in FIG. 7. A voltage divider comprising resistors 56 and 58 connected in series is disposed between output terminals 30 and 32. The center tap 60 between resistors 56 and 58 will develop a common mode voltage that is beta dependent. It is a property of the amplifier that the common mode gain is beta dependent in proportion to beta dependence of differential gain. Terminal 60 is connected to a null amplifier 62 which develops an output on connection 64 proportional to the common mode signal. Lead 64 is then connected in a negative feedback sense to the cascaded amplifier stages in block 52. For example, lead 64 may be coupled in a negative feedback sense to change the current applied to a terminal 14' or to change current $I_1$. (See FIG. 7.)

Figure 9:
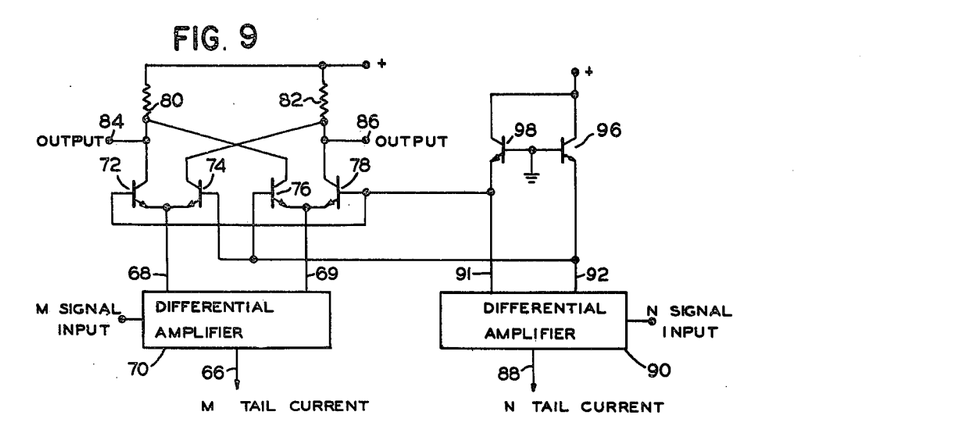
FIG. 9 is a schematic diagram of a differential four-quadrant multiplier circuit in accordance with the present invention.

FIG. 9 illustrates a four-quadrant multiplier according to the present invention employing a first differential amplifier 70. A first signal input, which we shall designate M, is applied as an input to differential amplifier 70 for proportioning a substantially constant M tail current 66 differentially between two outputs 68 and 69. A first pair of differentially connected transistors 72 and 74 have their emitters connected together and connected to the output 68. Similarly, a second differential pair of transistors 76 and 78 include emitter terminals connected to the aforementioned output 69. The first and second pairs of differentially connected transistors have their collector terminals cross-connected to load resistors 80 and 82 through which supply current flows from a positive source. Thus the collectors of transistors 72 and 76 are connected to resistor 80, while the collectors of transistors 74 and 78 are connected to resistor 82. The output is derived between terminals 84 and 86 connected respectively to the ends of the load resistors opposite the power supply.

A second differential amplifier 90 is employed for producing differential output currents 91 and 92 proportional to an N input signal. Output currents 91 and 92 total a substantially constant N tail current at 88. Output current 92 is connected to the base terminals of transistors 74 and 76, while the output current 91 is connected to the base terminals of transistors 72 and 78.

Each of the differential amplifiers 70 and 90 is a type of circuit well known to those skilled in the art, and may, for example, correspond to the emitter-degenerative differential amplifier comprising transistors 40 and 42 in FIG. 7, with the base of transistor 40 receiving the input signal while the base of transistor 42 is connected to a bias voltage level or ground. Alternatively, amplifier 70 may comprise a linearized amplifier of the type illustrated in FIG. 2, receiving current input or inputs.

A pair of input device transistors 96 and 98 have their collector terminals connected to a positive source, their base terminals grounded, and their emitter terminals connecting respectively to the collector terminals of transistors 88 and 90. The FIG. 9 circuit is effective for producing an output between terminals 84 and 86 proportional to the product of input signals M and N, taking the respective sign of M and N into consideration. Thus, a four-quadrant multiplier is provided having substantially no inter-circuit coupling components and which is readily adapted to integrated circuit techniques. Moreover, input device transistors 96 and 98 effect linearization of the output with respect to the N input signal in the same manner as hereinbefore described in connection with the amplifier circuits. Thus, transistors 96 and 98 form the input devices for control device transistors 72, 74, 76, and 78.

Considering the multiplying operation of the FIG. 9 circuit in greater detail, each of the differential pairs 72-74 and 76-78 has the property of performing a multiplying function. For instance, the transistor pair 72-74 will apportion the current on lead 68 between the transistor collectors in accordance with the product of such current and the differential voltage applied to the transistor bases.

Multiplication depends upon a nonlinear or exponential characteristic of the transistors. The transconductance from base to collector of each of the transistors 72 and 74 is proportional to the emitter tail current. Therefore, as the current on lead 68 is increased, the differential output procured with transistors 72 and 74, in response to differential base voltage input, is multiplied in proportion to the current on lead 68. Although the circuit multiplies as a result of a nonlinear operating characteristic, the multiplication is accomplished without distortion. The base voltages are "predistorted" by means of transistors 96 and 98 such that the multiplication is accomplished without distortion as to the "N" signal input factor. Thus, transistors 96 and 98 receive current outputs at 92 and 91 producing voltages across transistors 96 and 98 which are logarithmically related to the input currents. The ensuing exponential distortion in transistors 72 and 74 is cancelled by such logarithmic conversion. Multiplication is nonetheless accomplished because of the nonlinear operation of the transistor 72-74 pair.

Of course, one pair of transistors does not accomplish four-quadrant multiplier operation. For this purpose, transistor pair 76-78 is also utilized, with the outputs of the two pairs being reversely connected. Each pair will have an opposite effect on the output. The "sign" of the ultimate output at 84-86 depends upon which pair output predominates, that is, upon which pair receives the larger emitter current from differential amplifier 70 and delivers the same to resistors 80 and 82. If the "M" input is at bias level, no differential output is produced. If the "M" input signal is above the bias level of amplifier 70, one of the leads 68, 69 will deliver more current than the other producing an output in a first sense. If the "M"

input signal is below the bias level of amplifier 70, the opposite one of leads 68, 69 will deliver more current. The ultimate output will then depend not only on the magnitude but also on the sign of the "M" input.

Since each pair, e.g. transistors 72-74, is a differential circuit, the output "sign" will depend also on the "sign" of the "N" signal input relative to the bias level of differential amplifier 90. E.G., if the "N" signal input is at ground, and the bias level of amplifier 90 is ground, equal outputs will be delivered at 91 and 92 whereby neither the output of transistor 72 nor the output of transistor 74 will predominate. Similarly, neither the output of transistor 76 nor the output of transistor 78 will predominate. However, if the "N" signal is above or below bias level, the sense or sign of the output at terminals 84 and 86 will be governed accordingly. The magnitude of the output will be proportional to the "N" input.

Figures 10, 11:
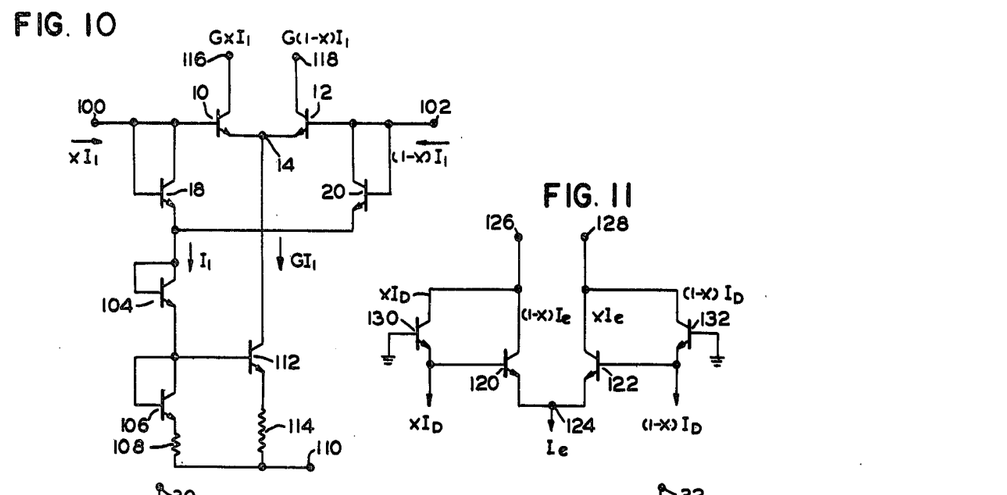
FIG. 10 is a schematic diagram of a circuit according to the present invention wherein gain is controlled to be substantially independent of supply currents.
FIG. 11 is a schematic diagram of an alternative form of an amplifier circuit according to the present invention, which circuit may be employed as a four-quadrant multiplier.

FIG. 10 illustrates a circuit according to the present invention for producing precise gain in spite of possible changes in supply current. The circuit is based upon the circuit illustrated in FIG. 2, and like components are referred to with like reference numerals. An input current $xI_1$ is provided at terminal 100 and a complementary input current $(1-x)I_1$ is provided at terminal 102. In this circuit, the emitters of transistors 18 and 20 are connected together and therefore the current $I_1$ flows through diode-connected transistor 104 employed for voltage dropping purposes. The current $I_1$ similarly flows through diode-connected transistor 106 and resistor 108 to common return terminal 110. The juncture between the emitter of transistor 104 and the base-collector connection of transistor 106 is connected to the base terminal of amplifier transistor 112, the latter having its emitter connected to common return terminal 110 through resistor 114. A gain factor of the circuit including transistor 112 is designated as G and is here equal to the ratio of the resistance of resistor 114 to that of resistor 108. Therefore a current $GI_1$ flows in the collector circuit of transistor 112. The collector of transistor 112 is connected to terminal 14, so the common current to transistors 10 and 12 is equal to $GI_1$. It will be seen, then, that the output currents at terminals 116 and 118, connected respectively to the collectors of transistors 10 and 12, will equal $GxI_1$ and $G(1-x)I_1$. The amplification of the circuit with respect to the input index, x, equals G, and is not affected by changes in the supply current $I_1$.

FIG. 11 illustrates another circuit according to the present invention which is similar to the amplifier stage illustrated in FIG. 5. Referring to FIG. 11, differentially connected transistors 120 and 122 have their emitter terminals connected together for receiving a current $I_e$ at terminal 124. The output for this stage is differentially provided between terminals 126 and 128 connected to the collectors of transistors 120 and 122. Input device transistors 130 and 132 have their emitters connected to the base terminals of transistors 120 and 122 respectively, with their base terminals being grounded. Complementary input currents $xI_D$ and $(1-x)I_D$ are provided at the emitter terminals of transistors 130 and 132. The circuit as thus far described operates in the same manner as the circuit illustrated in FIG. 3 to provide linear amplified complementary output currents in response to complementary input currents. The current from the collector of transistor 120 equals $(1-x)I_e$ and the current from the collector of transistor 122 equals $xI_e$. However, in the circuit according to FIG. 11, the input currents $xI_D$ and $(1-x)I_D$ are added in an out-of-phase sense to the output currents. The collector of transistor 130 is connected to the collector of transistor 120, and the collector of transistor 132 is connected to the collector of transistor 122, this being essentially the reverse of the FIG. 5 configuration.

Consideration of the FIG. 11 circuit will reveal that if $I_e$ equals $I_D$, the differential output between terminals 126 and 128 will be zero. However, the output will become larger if $I_e$ is increased or decreased from the value of $I_D$. The circuit according to FIG. 11 may be employed to provide four-quadrant multiplier operation. For this purpose the circuit output must be taken differentially between terminals 126 and 128.

Figure 12:
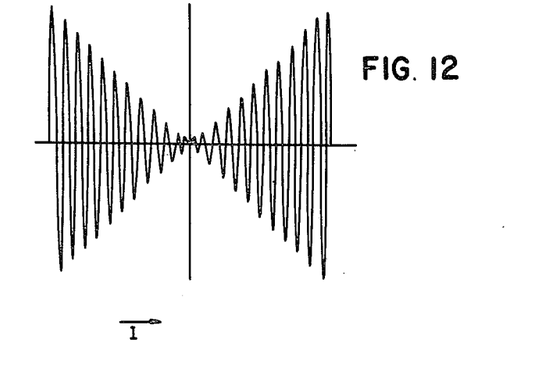
FIG. 12 illustrates an alternating current output for a four-quadrant multiplier.

FIG. 12 illustrates an alternating current output as derived between output terminals of a four-quadrant multiplier, e.g. such as the one illustrated in FIG. 9. It is seen that the polarity of the output signal changes as the polarity of I, corresponding to an input signal, changes.

Figures 14, 15, 16:
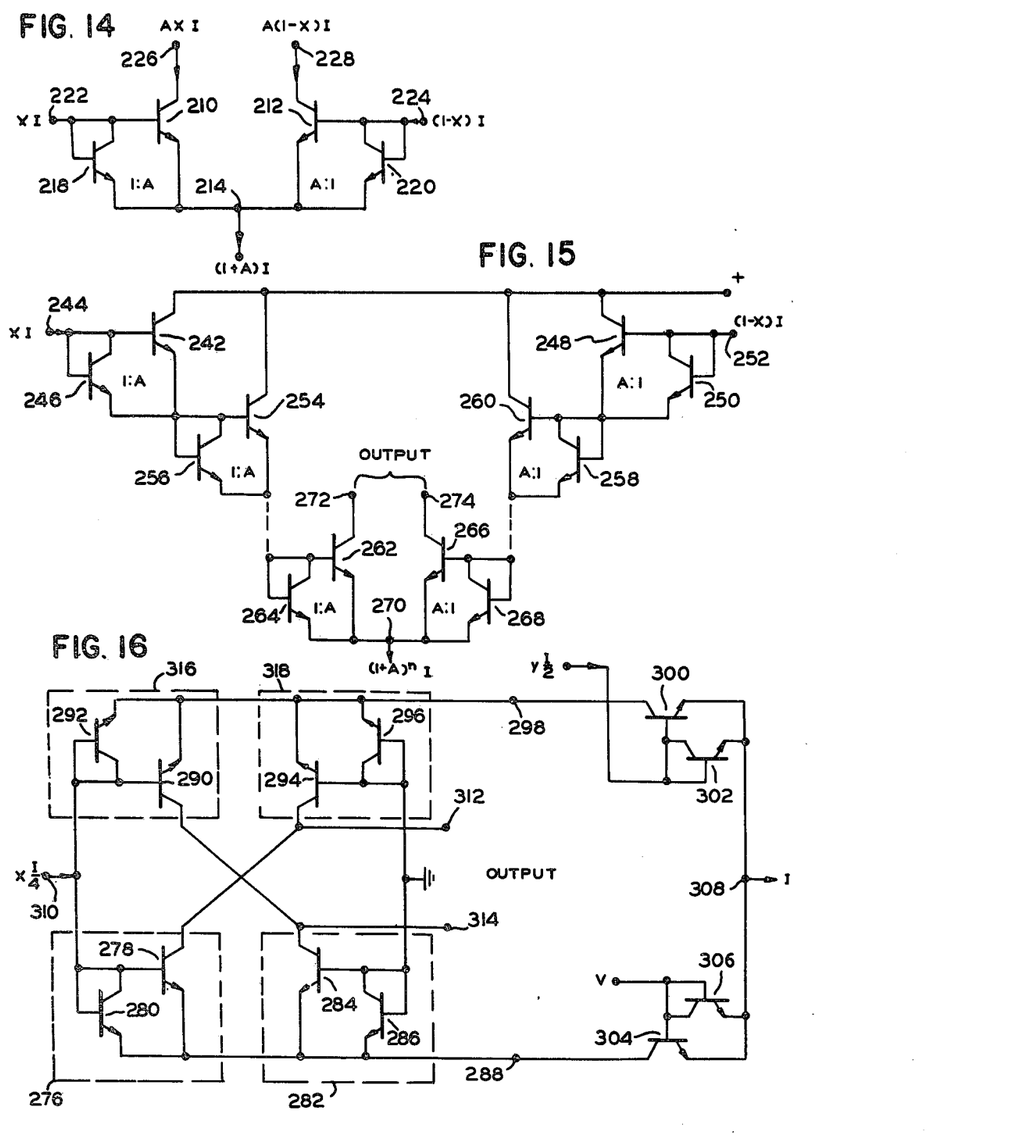
FIG. 14 is a schematic diagram of another differential amplifier according to the present invention.
FIG. 15 is a schematic diagram of yet another differential amplifier according to the present invention comprising a plurality of stages.
FIG. 16 is a schematic diagram of an additional four-quadrant multiplier according to the present invention.

Referring to FIG. 14, another differential amplifier according to the present invention comprises first and second control devices 210 and 212, here comprising NPN transistors, differentially coupled, with their emitters connected at terminal 214. A pair of input devices 218 and 220, here comprising diode-connected NPN transistors, are disposed across the base-emitter junctions of transistors 210 and 212. Thus, the base and collector of transistor 218 are connected to the base of transistor 210 while the emitter of transistor 218 is connected to terminal 214. Transistor 220 is similarly coupled with respect to transistor 212. The base of transistor 210 is connected to circuit input terminal 222 while the base of transistor 212 is connected to circuit input terminal 224. The collector of transistor 210 is connected to circuit output terminal 226 while the collector of transistor 212 is connected to circuit output terminal 228.

In the case of transistors 210 and 212, the collector is considered the output terminal, and the base comprises a control terminal while the emitter is denominated a common or return terminal. It is understood that other control devices as well as input devices having similar characteristics may be substituted for the transistors shown in some embodiments of the present invention.

Transistors 210 and 218 have the same characteristics and are desirably formed as parts of the same integrated circuit structure. Each semiconductor junction, for example the base-emitter junction of transistor 210, is characterized by a logarithmic voltage versus current relationship. The diode-connected transistor 218 is also characterized by a logarithmic voltage versus current relationship. Thus, if a linearly changing current is provided at terminal 222, which flows through transistor 218 to terminal 214, the voltage appearing across the base-emitter junction of transistor 218 is proportional to the logarithm of such current. If a linearly changing voltage was applied between the base and emitter of transistor 210, the output current in the collector of transistor 210 would be exponentially proportional to the base-emitter voltage. However, as stated above, the voltage applied across the base-emitter junction of transistor 210 is logarithmically related to current supplied at terminal 222, and therefore the output current at terminal 226 is linearly related to the current applied at terminal 222. The remainder of the circuit operates similarly with the logarithmic and exponential characteristics around the circuit of FIG. 14 cancelling one another to provide a differential current output at terminals 226 and 228 which is linearly responsive to the current differentially applied between terminals 222 and 224. As a consequence of the matching of logarithmic characteristics of the devices and of the differential circuit configuration, the circuit provides very linear gain and high bandwidth.

Let us assume the transistor emitter areas may be different, e.g. with the emitter of transistor 210 having an area A times the emitter area of transistor 218, while the areas of transistors 212 and 220 are similarly related. The amplification, A, in the FIG. 14 circuit is proportional to the ratio of emitter areas in each pair of transistors 210–218 and 212–220. The currents in the emitters of transistors 210 and 212 are A times larger than the input currents which flow in transistors 218 and 220. The terminal 214 is supplied with a current $(1+A)I$. When a differential pair of input currents xI and $(1-x)I$ are applied at terminals 222 and 224, output currents AxI and $A(1-x)I$ appear at terminals 226 and 228. These differential output currents are an amplified version of the differential input currents. "x" may be considered an input index.

Although the gain of this amplifier is equal to the area ratio, A, and is not readily changed electronically, the amplifier of FIG. 14 can have certain advantages over the differential amplifiers hereinbefore described. The current from the common emitter connection is forced to ratio, i.e. between transistors 210 and 218, in accordance with the emitter areas. As a result, certain problems regarding bulk resistance are avoided when the transistor bulk resistances are not as low as might be desired. The current densities are the same for all transistors. The base-emitter voltage in a transistor, $$V_{be} = \frac{kT}{q} \ln \frac{I_E}{I_s} + \frac{I_E}{\beta} r_b \quad (13)$$

wherein q = charge on an electron, T is absolute temperature, k is Boltzmann's constant, $I_s$ is area related junction saturation current, $I_E$ is the emitter current, $\beta$ is transistor beta, and $r_b$ is the bulk resistance in the base of the transistor. The first or logarithmic term in the above equation is the desired logarithmic term which is to appear across transistor 218, for example, thus providing the desired base voltage applied to transistor 210. The second term in the expression (13) can produce an error at different input values, as in the case of my previous circuits, unless this second term is the same in the case of both transistors. It will be appreciated that an excess and variable voltage across one transistor junction as compared to the other could do quite a lot towards detracting from the desired logarithmic characteristics. If this term is the same in both transistors, then a balancing or cancelling will take place because the same voltages corresponding to the second term in expression (13) above will appear in the case of both transistors 210 and 218. In the FIG. 14 amplifier circuit according to the present invention, bulk resistances as between transistors 210 and 218 are substantially inversely proportional to emitter areas, while the currents ratio in proportion to emitter areas, whereby to provide equal values for the second term in expression (13) for transistors 210 and 218.

Figure 18:
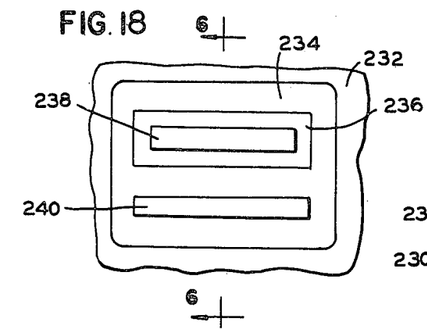
FIG. 18 is a plan view of a semiconductor integrated circuit embodiment of one component of an embodiment of the present invention.
Figure 19:
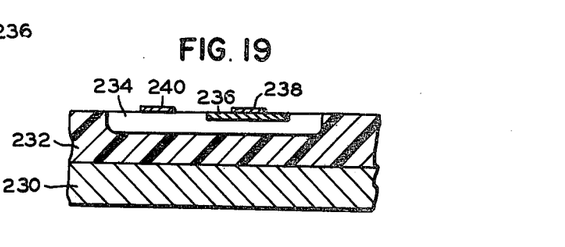
FIG. 19 is a cross section at 6—6 in FIG. 18.

Steps are taken to insure the bulk resistances are inversely proportional to emitter area. Thus, referring to FIGS. 18 and 19 illustrating a transistor in an integrated circuit structure, this transistor comprises a P type substrate 230 supporting an N type epitaxial layer 232. A P type base diffusion 234 is provided between an emitter diffusion 236 and epitaxial layer 232, and connections 238 and 240 are made respectively to the emitter diffusion and the base diffusion. The epitaxial layer 232 provides the collector with connection being made thereto by means not shown.

Figure 20:
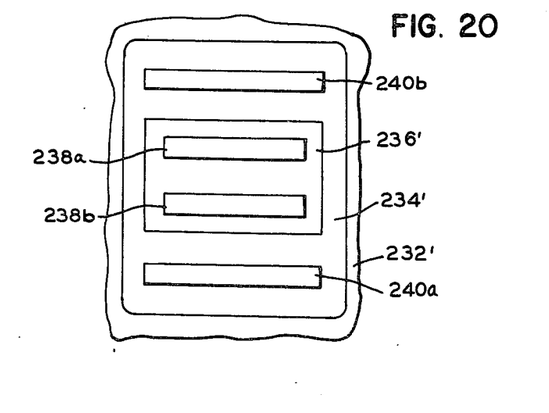
FIG. 20 is a plan view of a semiconductor integrated circuit embodiment of another component of an embodiment of the present invention.

The transistor of FIGS. 18 and 19 represents transistor 218 in FIG. 14. Suppose it is desired that transistor 210 have an emitter area twice as large providing twice as large a current therethrough with a bulk resistance that is half that of transistor 218 whereby the voltage drops across the bulk resistances of transistors 210 and 218 will balance. Accordingly, a transistor such as illustrated in FIG. 20 may be formed, e.g. on the same substrate, having an emitter 236′ which is twice as large. Emitter 236′ is provided with connections 238a and 238b which are interconnected by means not shown. Base connections 240a and 240b are here provided at either side of enlarged emitter 236′ in order to duplicate twice over the resistive paths found in the transistor as illustrated in FIGS. 18 and 19. The resistance paths principally contributing to bulk resistance will be duplicated twice over in the case of the FIG. 20 circuit principally because of its symmetry. Just simply doubling the emitter area would not necessarily halve the base resistance unless double the cross sectional path is provided from the base connection to and under the emitter in the resistive base region. Other symmetrical configurations and the like will occur to those skilled in the art for assuring that the bulk resistances are inversely proportioned to emitter area. The bulk resistances are thereby scaled to be always inversely proportional to the ratio of currents therethrough. As a result of this, and with the common emitter connection permitting current division, the circuit of FIG. 14 will be essentially bulk-resistance independent, thereby providing enhanced linearity for the circuit. The voltage drops across the bulk resistances (e.g. as referred to the emitter) are always equal and have been essentially eliminated from consideration. So far as the logarithmic term in expression (13) is concerned, it is noted that the temperature dependence of the logarithmic characteristic is the same for each transistor, so the output is substantially independent of temperature. Construction on an integrated circuit structure is preferred, and the temperature will then be essentially the same for each transistor.

The differential amplifier circuit of FIG. 14 may be considered as comprising a pair of differentially connected circuits, each having three terminals, i.e. an input terminal, an output terminal, and a common terminal. In the FIG. 14 amplifier, one such circuit is comprised of transistors 210 and 218 while the other such circuit comprises transistors 212 and 220. In the 210–218 circuit, terminal 222 comprises the input terminal, terminal 226 is the output terminal, and terminal 214 is the common terminal, which, in this case, also forms the common terminal for the 212–220 circuit. Each of the differentially connected circuits is adapted to provide an output current linearly proportional to its input current while being characterized by a logarithmic operating characteristic relating voltage to current in said circuit.

In FIG. 15 a cascaded differential amplifier includes a number of circuits of the FIG. 13 type intercoupled in cascaded relation to enhance the overall amplification. A first circuit in FIG. 15 includes a transistor 242 having its base connected to input terminal 244. Diode-connected transistor 246 is disposed across the base-emitter junction of transistor 242. A second such circuit, completing a first differential stage, comprises a similar transistor 248 having a diode-connected transistor 250 disposed across the base-emitter junction thereof. The base of transistor 248 is connected to input terminal 252. Differential input currents, xI and (1−x)I are applied between input terminals 244 and 252.

The common return terminal of the circuit 242–246 is connected to the input terminal of a third circuit comprising similarly connected transistors 254 and 256. Likewise, the common terminal of the circuit 248–250 connects to the input terminal of a circuit comprising transistors 258 and 260. The collectors of transistors 242, 254, 260, and 248 are suitably connected to a common positive voltage terminal. As thus appears, a differential pair comprising circuit 242–246 and circuit 248–250 differentially drives the circuits 254–256 and 258–260. A differential output stage comprises a first circuit including transistors 262 and 264 and a second circuit comprising transistors 266 and 268, connected as hereinbefore described. The common terminals for both the last mentioned circuits are connected to a common current terminal 270, while the collectors of the transistors 262 and 266 provide differential output currents. Output terminals 272 and 274, to which the collectors of transistors 262 and 266 respectively connect, are suitably returned to a positive voltage point through a pair of load resistors (not shown) whereby a differential voltage output will then be provided between terminals 272 and 274.

The circuits of FIG. 15 not only provides the linearity and bandwidth of the FIG. 1 circuit, with bandwidths of several hundred megacycles being typical, but the FIG. 15 circuit further provides increased gain by virtue of the cascading of stages. Also, the FIG. 15 circuit shifts the voltage level negatively by $V_{BE}$ for each differential stage, where $V_{BE}$ is the base-emitter voltage for a transistor. This feature of DC negative shifting is normally difficult to achieve in a wideband amplifier employing NPN components. The collectors of earlier stages, e.g. the collectors of transistors 254 and 260, can also be connected to output terminals 272 and 274 if so desired, but at the expense of bandwidth and level shifting.

For the FIG. 15 circuit, the emitter area of the control transistors, such as the emitter area of transistor 242, need not be larger than the emitter area of the input transistors, for example the emitter area of transistor 246. If the areas are equal in each case, the circuit will achieve a gain of two for each stage. In any case, the bulk resistances should be ratioed inversely to the emitter areas as discussed in connection with the circuit of FIG. 14. A circuit such as that of FIG. 15 is well adapted to integrated circuit techniques as are other circuits disclosed herein.

In FIG. 16 is illustrated a four-quadrant multiplier composed of circuits of the type employed in FIG. 14, each providing an output current linearly proportional to input current while being characterized by a logarithmic operating characteristic relating voltage in said circuit to input current. One such circuit is indicated within dashed lines at 276 and comprises a transistor 278 having its base-emitter junction shunted by a diode-connected transistor 280. A second such circuit, differentially connected to the first, is indicated within dashed lines at 282 and includes a transistor 284 having its base-emitter junction shunted by diode-connected transistor 286. The emitters of transistors 278, 280, 284, and 286 are connected to a first current terminal 288. Further similarly connected pairs of transistors 290–292 and 294–296 are also disposed in differential relation having the emitters of the last-mentioned transistors connected to a second current terminal 298. Current terminals 288 and 298 are suitably differentially driven by a differential circuit comprising transistor pairs 300–302 and 304–306, the emitters of which are connected at terminal 308 through which a tail current I flows. The collectors of transistors 300 and 304 are connected respectively to current terminals 298 and 288, while the base of transistor 304 is connected to a voltage reference, V, typically a few tenths of a volt negative. The emitter areas in the FIG. 16 circuit are assumed equal. One multiplier input, y, is proportional to one of the factors to be multiplied, with $1>y>0$. The current y(I/2) is applied to the base of transistor 300.

A second input, x, is proportional to a second factor to be multiplied, where $1>x>0$. A current x(I/4) is applied at terminal 310 with respect to ground, terminal 310 being connected in common to the base of transistor 278 and the base of transistor 290. The base terminals of transistors 286 and 294 are grounded. Therefore, the current value representative of a second factor to be multiplied is applied between input terminals of the circuits 278–280 and 284–286, as well as between the input terminals of circuits 290–292 and 294–296.

The output terminals of the circuits are cross-connected, and are further coupled to output terminals 312 and 314. Thus, the collectors of transistors 294 and 278 are connected to output terminal 312, while the collectors of transistors 290 and 284 are connected to terminal 314. The outputs at terminals 312 and 314 are supplied as differential currents and may be transformed into voltages by means of resistors (not shown) disposed between terminals 312 and 314 respectively, and a source of voltage. The output connections are crossed to provide an output wherein the differential circuits oppose one another in out-of-phase relation relative to the x factor input. With the circuit balanced, that is in the zero input condition, both x and y factors equal ½. If the y input remains balanced and the x input is changed, the respective outputs from the two differential circuits will still cancel since they are in opposition. On the other hand, if the x input remains balanced, and the y input is unbalanced, it can be seen that the outputs will also cancel as should be the case for four-quadrant multiplication. Now, if the x and y inputs are both unbalanced, either the differential output from the differential stage 316–318 or from the differential stage 276–282 will predominate and produce a net output according to the value of the y input. The x input similarly determines the differential inbalance in each of the stages 316–318 or 276–282. It will be seen that the resultant output will agree with the product in both absolute value and sign.

Consideration of the circuit will show that the collector currents are as follows: $I_{300}$, the collector current from transistor 300, $=yI/2$; $I_{304}$, the collector current from transistor 304, $=(1−y)$ I/2; $I_{290}$, the collector current from transistor 290, $=xy$ I/4; $I_{294}$, the collector current from transistor 294, $=(1−x)$ yI/4; $I_{278}$, the collector current from transistor 278, $=x(1−y)$ I/4; and $I_{284}$, the collector current from transistor 284, $=(1−x)(1−y)$ I/4. Summing the currents at output terminals 312 and 314 shows that the differential output is XYI/4 where X=2x−1, and Y=2y−1, where X lies in the range, +1 to −1, and so does Y.

The multiplicative output of the FIG. 16 circuit is much more insensitive to bulk resistance than is the case in prior circuits. Thus, the output currents are very linearly related to the x and y signals. This is notwithstanding the fact that a non-linear characteristic is employed in each of the circuits 276, 282, 316, and 318 for achieving multiplication. As indicated, the x signal, for example, is predistorted logarithmically in transistor 280, for example, providing a logarithmic voltage at the base of transistor 278. Then transistor 278 produces an output current which is exponentially related to this logarithmic voltage.

Multiplication takes place with respect to the current provided to the emitter of transistor 278, for example, inasmuch as the transconductance from base to collector of transistor 278 is proportional to the emitter tail current. Nevertheless, the multiplication is accomplished without distortion as to the x factor. In the FIG. 16 circuit, the differential stage comprising circuits 300–302 and 304–306 linearly transforms a y current input into a differential current signal for application to current terminals 288 and 298.

As will be noted, the differential stages 276–282 and 316–318 correspond to the differential stage illustrated in FIG. 14. The multiplier of FIG. 16 thereby attains advantages of being substantially bulk resistance-independent inasmuch as the control device transistors (e.g. transistor 278) and the input device transistors (e.g. transistor 280) are connected together and to a common differential return in each case. As a result of this bulk resistance independence, the present circuit is found to exhibit improved linearity as regarding this bulk-resistance factor.

Figure 17:
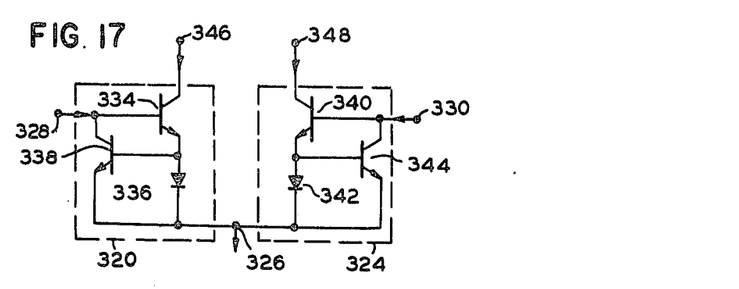
FIG. 17 is a schematic diagram of a differential circuit for alternative use according to the present invention.

Although the circuit of FIG. 16 is highly efficacious as regards wide bandwidth and ultra-linear operation, a further step in the linearization is provided employing the differentially connected circuits as illustrated in FIG. 17. These circuits, 320 and 324, may also each be described as receiving a current input and providing a current output linearly related thereto while being characterized by a logarithmic operating characteristic relating voltage to current. Each of the circuits 320 and 324 is further of the type disclosed and claimed in the copending application of George R. Wilson, entitled, "Current Regulating Circuit", Ser. No. 704,106, filed Feb. 8, 1968, and assigned to the assignee of the present invention. The stage of FIG. 17 may be substituted for the differential stages in FIG. 16, for example, for providing enhanced independence from changes in effective transistor beta inasmuch as the resultant transistor beta in the FIG. 4 circuit is quite high.

Referring to FIG. 17, differential circuit 320 comprises a first NPN transistor 334 having its emitter connected to the anode of the diode 336 and having its base connected to circuit input terminal 328, while the collector of transistor 334 is is connected to circuit output terminal 346. The cathode of diode 336 is connected to common terminal 326 as well as to the emitter of a second NPN transistor 338 having its base connected to the anode of the diode and its collector connected to the base of transistor 344. A second circuit 324 employs transistors 340 and 344 as well as the diode 342 which are similarly connected with respect to circuit input terminal 330, circuit output terminal 348, and common terminal 326. The semiconductor junction diodes 336 or 342 may comprise diode-connected transistors if desired, and such is usually advantageous in an integrated circuit embodiment of the invention.

In each of the junction devices of circuit 320, for example, a linearly changing current through the junction produces a logarithmically changing voltage thereacross. Thus, this is true of the voltage across diode 336 as the current at terminal 328 increases linearly. This voltage is applied to the base of transistor 338 and such logarithmically changing voltage then appears at the base of transistor 334. The current in transistor 338 changes linearly with the change in input current, and the output current through terminal 346 changes linearly with change in input current. The feedback amplification employed in the FIG. 17 circuit enchances the effective beta of the circuit and causes operation of the circuit to be largely beta-independent.

Figure 21:
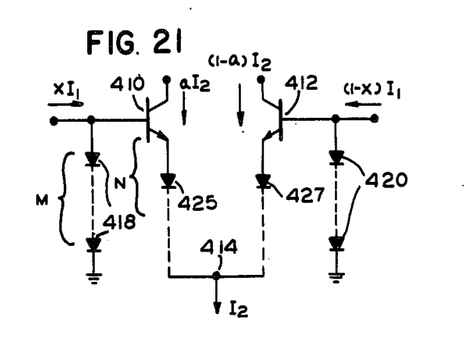
FIG. 21 is a schematic diagram of a circuit according to the present invention for generating complex arithmetic functions.

Referring again to FIG. 2, it will be apparent that this circuit as well as the other circuits according to the present invention may be considered as a closed loop circuit having a node such as a ground point and including semiconductor junctions arranged in cancelling pairs around the loop. Each of the semiconductor junctions obey the same exponential law or have the same exponential characteristic, $e^{qv/kt}$ relating voltage to current as can be seen in expressions (1) through (6). Means provide input current through at least one such semiconductor junction in the loop, causing substantially all the junctions to be conducting at the same time, while other means provide as output from at least one junction, either as a current through a junction or as a voltage at a junction with respect to a node. As a result of operation of the circuit it can be said the product of currents in junctions, whose voltage polarities are positive with respect to a loop node, is essentially proportional to the product of the currents in junctions whose polarities are negative with respect to the same node. This result can be concluded from expression (7) et seq., and particularly expression (10). The constant of proportionality is the ratio of the product of the saturation currents of the former set of junctions to the latter set of junctions. Generally this constant of proportionality is chosen to be one, particularly in the case of integrated circuit embodiments. A further circuit utilizing these properties is illustrated in FIG. 21 wherein a differential pair of transistors 410 and 412 each have their emitters returned to common terminal 414 through N series connected junctions indicated at 425 and 427. The number N includes the emitter junctions of transistors 410 and 412. Furthermore, a set of M series connected junctions 418 is disposed between the base of transistor 410 and ground while M series connected junctions 420 are disposed between the base of transistor 412 and ground. The junctions are all substantially identical and exhibit the same exponential characteristics. The output, a, is the proportion of the current $I_2$ provided at terminal 414 appearing at the collector of transistor 410.

If M=N=1, the circuit reduces to the FIG. 2 circuit and operates in a substantially similar manner. The same results obtain if M=N. However, if the ratio of M/N is different than one, other useful results can be produced. For example, if M/N equals 2, then $a=(x^2/1-2x+2x^2)$. Other functions may be provided by other ratios of M/N, and combinations of functions may be produced by combinations of circuits of the FIG. 21 type.

Figure 22:
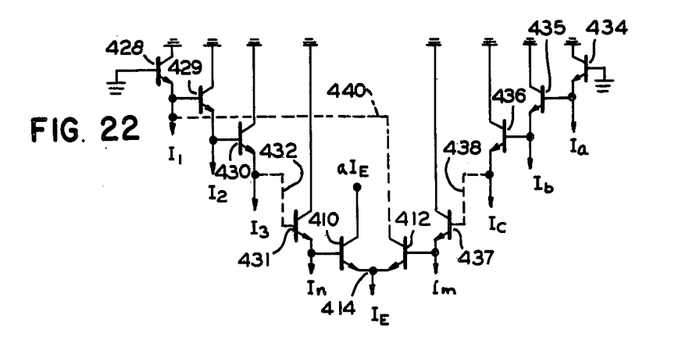
FIG. 22 is a schematic diagram of another circuit according to the present invention for generating complex arithmetic functions.

Another useful circuit is illustrated in FIG. 22 comprising a differential circuit composed of transistors 410 and 412 receiving a common current $I_E$ at the common emitter connection 414. An input device comprising a transistor 431 has its emitter connected to the base of transistor 410 while its collector is grounded. Similarly, the emitter of input device transistor 437 is connected to the base of transistor 412 and the collector of transistor 437 is grounded. Thus far, the circuit is similar to that illustrated in FIG. 3, and operates in a similar manner.

The FIG. 22 circuit additionally includes cascaded transistors 429-430 wherein the base of transistor 428 is grounded and the emitter of each of these transistors drives the base of a following transistor. The collectors of transistors 428-430 are grounded and the emitters receive currents $I_1$, $I_2$, and $I_3$, respectively. The connection 432 from the emitter of transistor 430 to the base of transistor 431 is dashed to indicate the possible insertion of additional transistors connected in a similar manner. The emitter current for transistor 431 is indicated as $I_n$. Likewise, transistors 434-436 are connected with the base of transistor 434 grounded and the emitter of each of these transistors driving the base of a subsequent transistor. The transistor collectors are grounded and the emitters are respectively provided with currents $I_a$, $I_b$, and $I_c$. This circuit makes use of the fact that the gain of the outer transistors, for example transistors 428, 430, and 434-436, allows input current to control only one junction voltage. For example, $I_3$ affects only the voltage across transistor 430. It is also noted, for example, that the emitter junctions of transistors 428, 429, and 430 are serially disposed between the base of transistor 431 and a ground node at the base of transistor 428.

The connection 438 between the emitter of transistor 436 and the base of transistor 437 is illustrated by dashed lines to indicate the possible inclusion of further transistors, with the emitter current of transistor 437 being $I_m$. In the actual circuit, the collector of transistor 412 is connected by means of lead 440 to the emitter of transistor 428 such that the current $I_1$ for the emitter of transistor 428 is supplied from the collector of transistor 412. However, for the moment, consider the circuit without connection 440.

Employing the aforementioned analysis, i.e. setting the product of currents through junctions of a first polarity equal to the product of currents through junctions of a second polarity, the following equation results:

$$(I_1 I_2 I_3 \ldots I_n) a I_E = (I_a I_b I_c \ldots I_m)(1-a) I_E \quad (14)$$

The term $(1-a)I_E$ is awkward, and we can eliminate the same by connecting the output of transistor 412 to provide the current $I_1$ via connection 440 as hereinbefore indicated. As a result, $$(I_2 I_3 \ldots I_n) a I_E = (I_a I_b I_c \ldots I_m), \quad (15)$$

and $$a = \frac{I_a I_b I_c \ldots I_m}{I_E I_2 I_3 \ldots I_n} \quad (16)$$

Thus, one can generate a multiple product/quotient in one step. The circuit has the practical advantage of using many common collector devices which can be fabricated in a small area. One of the important features of the circuit is the use of the connection 440 from the output of one side of the differential circuit to an input device on the opposite side of the differential circuit. This connection will be spoken of as feedback connection. A useful circuit of this general type is also illustrated in FIG. 23.

Figures 23, 24:
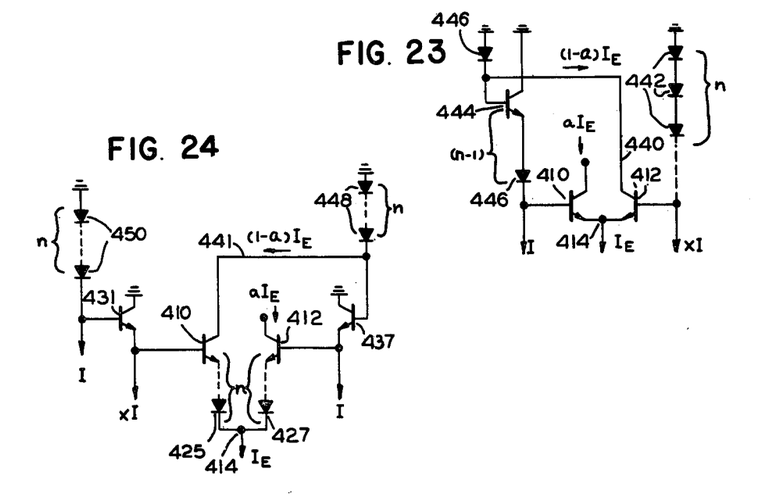
FIG. 23 is a schematic diagram of a power finding circuit according to the present invention.
FIG. 24 is a schematic diagram of a root finding circuit according to the present invention.

Referring to FIG. 23, a power finding circuit is illustrated. That is, this circuit is capable of providing an output proportional to the square, cube, or the like, of an input current. To the extent applicable, corresponding elements are referred to by means of the same reference numerals utilized for the FIG. 22 circuit. In this circuit, the input devices for transistor 412 comprise a series connection of n diodes 442 each having the same exponential characteristic as exhibited by the base emitter junction of transistor 412. In fact, each of the diodes 442 may comprise a diode-connected transistor formed on the same integrated circuit structure as the other transistors in the circuit. An input xI is provided through the series diodes 442 from ground.

The input device connection for transistor 410 comprises the collector-emitter path of transistor 444 in series with diodes 446 between ground and a current source I. A series of (n−1) junctions includes diodes 446 and the base-emitter junction of transistor 444. The feedback connection 440 couples the collector of transistor 412 to the base of transistor 444, and through a diode 446 to ground. Diode 446 is poled in the same polarity direction with respect to ground as the base emitter junction of transistor 444, i.e. the anode of diode 446 is grounded.

The loop equation from ground to ground can be written for the FIG. 23 circuit in the aforementioned manner, i.e. where the product of currents through junctions of a first polarity is set equal to the product of currents in the junctions of the reverse polarity. The equation is given as follows:

$$(1-a)I_E(I)^{n-1} a I_E = (1-a) I_E (xI)^n \quad (17)$$

$$\text{or, } a = I/I_E x^n \quad (18)$$

For the usual case where $I_E = I$, $a = x^n$. Of course, if $n=2$, this circuit is a squaring circuit.

A very simple polynomial generator can be built by tapping off voltages down the chain of diodes 442. Furthermore, a polynomial generator can be provided employing a plurality of circuits of the FIG. 23 type. For example, one circuit can generate the squared term, another circuit can generate a cubed term, etc., and the outputs are then added.

FIG. 24 illustrates an n root finder. Elements in this circuit are referred to employing reference numerals designating corresponding elements in the previous embodiments. In this circuit, a series of diodes 425 and 427 is disposed between the emitters of transistors 410 and 412, respectively, and terminal 414 where a current $I_E$ is supplied. n junctions are included in each emitter leg, with the emitter itself forming one such junction. A feedback connection 441 is here employed between the collector of transistor 410 and the base of input device 437. A series connection of n diodes 448 is disposed between connection 441 and ground. Also, a similar series connection of n diodes 450 is interposed between the base of transistor 431 and ground, these diodes carrying a current I from a current source. Again, all semiconductor junctions have substantially identical exponential characteristics. It is noted three junctions, including the emitter junctions of transistors 431 and 437, are disposed between each of the bases of transistors 410 and 412, and ground. A current I is also provided at the emitter of transistor 437, and a current xI is provided at the emitter of transistor 431 wherein x is the input variable.

The loop equation from ground to ground for the FIG. 24 circuit is:

$$(I)^n x I(1-a)^n I_E{}^n = a^n I_E{}^n I(1-a)^n I_E{}^n \qquad (19)$$

$$\text{or, } a = \frac{I}{I_E}\sqrt[n]{x}$$

$$\text{or, for } I_E = I, a = \sqrt[n]{x} \qquad (21)$$

When n=2, a square root circuit is provided. The output is a, or a proportion of the current $I_E$ delivered at the collector of transistor 412.

Figure 25:
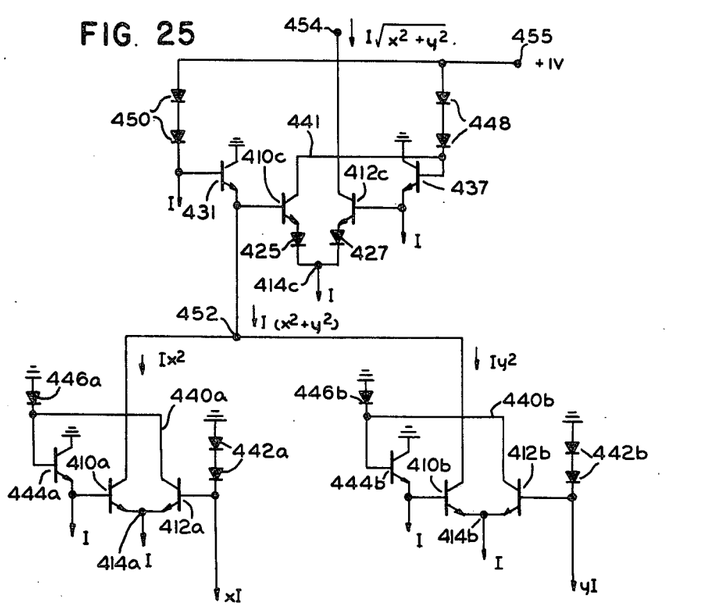
FIG. 25 is a schematic diagram of a circuit according to the present invention for providing the square root of the sum of the squares of two quantities.

The embodiment of FIG. 25 combines the circuits of the FIG. 23 and FIG. 24 type, to result in means for forming the square root of the sum of the squares of a pair of inputs here designated x and y.

Referring to FIG. 25, corresponding reference numerals are employed for components corresponding to those disclosed in FIGS. 23 and 24, with the components in FIG. 25 being further designated by the letters a, b, and c, according to the particular circuit indicated. The circuit including differential transistors 410a and 412a receives an input current xI flowing through a pair of series connected diodes 442a, and delivers an output Ix$^2$ at the collector of transistor 410a. This circuit thus corresponds to the FIG. 23 circuit wherein n=2.

Similarly, the circuit comprising differential transistors 410b and 412b receives a current yI flowing through diodes 442b, and delivers a current Iy$^2$ at the collector of transistor 410b. This circuit again corresponds to the FIG. 23 circuit with n equaling 2. The outputs Ix$^2$ and Iy$^2$ are added at terminal 452 to provide a combined current I(x$^2$+y$^2$).

The last mentioned current is provided as an input at the emitter of transistor 431 of a root finding circuit including differential transistors 410c and 412c. The latter circuit corresponds to the circuit disclosed in FIG. 24, with n equaling 2, whereby the square root is extracted and provided at terminal 454 connected to the collector of transistor 412c. A supply of +1 volt is conveniently provided at terminal 455 connected to series diode chains 448 and 450 so as to supply the proper bias for these diodes. The output of the FIG. 25 circuit at terminal 454 is thus $I\sqrt{x^2+y^2}$.

Numerous other arithmetic circuits are possible according to the concept of the present invention, i.e. employing a closed loop of semiconductor junctions arranged in cancelling pairs wherein the semiconductor junctions are each characterized by the same exponential operating law. Various combinations of such junctions in the closed loop circuit will result in differing mathematical results.

There is thus provided according to the present invention a wideband differential amplifier exhibiting linear gain and wherein voltage swings are virtually eliminated. The gain-bandwidth product of the amplifier approaches $f_T$ for the transistors. The circuitry according to the present invention is well adapted to integrated circuit techniques since no interstage coupling elements need be employed, and integrated circuit capacitance presents no problem. The circuit is very stable, but the gain thereof may be adjusted when desired and preset by means of varying an externally applied current. Furthermore, the circuit may be adapted to provide multiplier action wherein one of the terms multiplied is such externally supplied current. Many other arithmetic functions are also achieved. The circuit is also uncomplicated and very insensitive to temperature changes.

The circuitry according to the present invention is well adapted to planar integrated circuit fabrication processes. As a matter of fact, a number of advantages of the present circuit are made possible by fabrication in this manner. For example, the saturation current $i_s$ hereinbefore described is substantially the same for transistors on the same die. Moreover, thermal coupling is very tight. Also, the successful implementation of cascaded circuits according to the present invention is aided by utilization of transistors having low collector saturation voltages, which can be the case with integrated circuit devices.

When the term amplifier is used in the present application, it is not meant to imply that in every case a gain of more than one is indicated. For some applications, the present circuits are useful for linear transfer even though a gain of one or less is procured. Such will be the case for the differential amplifier stages employed in the multiplier, for example.

While I have shown and described preferred embodiments of my invention, it will be apparent to those skilled in the art that many changes and modifications may be made without departing from my invention in its broader aspects. I therefore intend the appended claims to cover all such changes and modifications as fall within the true spirit and scope of my invention.

I claim:

1. A multiplier circuit, comprising:
    a differential amplifier employing a pair of semiconductor junction devices characterized by exponential operating characteristics for receiving a first electrical value and a second electrical value representative of factors to be multiplied and for nonlinearly processing said electrical values to produce a third electrical value representative of the product of said factors; and
    at least one further semiconductor junction device coupled to a junction of one of said pair of semiconductor junction devices, and characterized by an exponential operating chracteristic substantially identical to the chracteristics exhibited by said pair of devices.
    wherein the exponential operating characteristics of said pair of devices causes a nonlinear distortion of at least one of said first and second values, and the exponential operating characteristic of said further device causes a nonlinear predistortion of said one of said values to substantially cancel the distortion to provide a linear product thereby.

* * * * *

UNITED STATES PATENT AND TRADEMARK OFFICE
CERTIFICATE OF CORRECTION

PATENT NO. : 4,156,283
DATED : May 22, 1979
INVENTOR(S) : Barrie Gilbert

It is certified that error appears in the above-identified patent and that said Letters Patent are hereby corrected as shown below:

Column 4, Line 29, reads "ae realized" – should be --are realized--

Column 4, Line 45, reads "$xI_D + I_e = I_1(1-xId)$" – should be --$xI_D I_e = I_1(1-x)I_D + I_d$)--

Column 4, Line 65, reads "qv/kt 1);" should be --qv/kt  1--

Column 5, Line 11, reads "$(1-x)I_e$ and $xIe$", should be --$(1-z)I_e$ and $xI_e$--

Column 15, Line 56, reads "is is connected" – should be --is connected-- (our error)

Column 16, Line 59, reads "$(x^2/1 - 2x + 2x^2)$" – should be --$x^2/(1 - 2z + 2x^2)$--

Signed and Sealed this

Second Day of October 1979

[SEAL]

Attest:

RUTH C. MASON
Attesting Officer

LUTRELLE F. PARKER
Acting Commissioner of Patents and Trademarks